United States Patent
Taha et al.

(10) Patent No.: US 11,251,745 B2
(45) Date of Patent: Feb. 15, 2022

(54) ARTICULATING JOINT SOLAR PANEL ARRAY

(71) Applicant: Nevados Engineering, Inc., San Francisco, CA (US)

(72) Inventors: Yezin Taha, San Francisco, CA (US); Norman Xiao, San Francisco, CA (US)

(73) Assignee: NEVADOS ENGINEERING, INC., San Francisco, CA (US)

( * ) Notice: Subject to any disclaimer, the term of this patent is extended or adjusted under 35 U.S.C. 154(b) by 453 days.

(21) Appl. No.: 15/533,189

(22) PCT Filed: Dec. 11, 2015

(86) PCT No.: PCT/US2015/065382
§ 371 (c)(1),
(2) Date: Jun. 5, 2017

(87) PCT Pub. No.: WO2016/094864
PCT Pub. Date: Jun. 16, 2016

(65) Prior Publication Data
US 2017/0366133 A1 Dec. 21, 2017

Related U.S. Application Data

(60) Provisional application No. 62/091,385, filed on Dec. 12, 2014.

(51) Int. Cl.
*H02S 20/30* (2014.01)
*H02S 20/10* (2014.01)
(Continued)

(52) U.S. Cl.
CPC .............. *H02S 20/30* (2014.12); *F24S 25/12* (2018.05); *F24S 30/425* (2018.05);
(Continued)

(58) Field of Classification Search
CPC ....... F16C 35/02; H02S 20/10; H01L 31/0547
See application file for complete search history.

(56) References Cited

U.S. PATENT DOCUMENTS

2003/0015625 A1 1/2003 McGee et al.
2008/0308091 A1 12/2008 Corio
(Continued)

FOREIGN PATENT DOCUMENTS

JP 2013021287 A 1/2013
WO 2011/047828 A1 4/2011
WO 2012152344 A2 11/2012

OTHER PUBLICATIONS

Ishaque et al., "A review of maximum power point tracking techniques of PV system for uniform insolation and partial shading condition", Renewable and Sustainable Energy Reviews 19 (2013) 475-488. (Year: 2013).*

(Continued)

*Primary Examiner* — Tae-Sik Kang

(57) ABSTRACT

Systems and methods for providing and controlling solar panel arrays are provided. The solar panel array may include one or more articulating joints that may provide variability in the arrangement of solar panels, which may allow the solar panel array to be distributed over varying types of underlying surfaces. The articulating joints may allow orientations of solar panels to be different relative to one another. The articulating joints may convey rotational force across the joints, so that a rotational force used to drive a first solar panel may also be conveyed across the joint and used to drive a second solar panel. The controls system may include row-specific semi-autonomous, or autonomous, controllers as well as controllers to interface with multiple rows. The controllers may include sensors to measure system power generation and basic operations aspects of the solar field to directly measure, or infer, module shading within the
(Continued)

solar field. The controller may use this shading and operations data to identify shading, mitigate shading, identify methods to increase power generation, and identify optimum tilt angles for the tracker rows.

16 Claims, 8 Drawing Sheets

(51) Int. Cl.
*F24S 30/425* (2018.01)
*F24S 25/12* (2018.01)
*H01L 31/042* (2014.01)

(52) U.S. Cl.
CPC ............ *H01L 31/042* (2013.01); *H02S 20/10* (2014.12); *Y02E 10/47* (2013.01)

(56) References Cited

U.S. PATENT DOCUMENTS

| | | |
|---|---|---|
| 2009/0320898 A1 | 12/2009 | Gumm |
| 2011/0041834 A1 | 2/2011 | Liao |
| 2011/0108019 A1* | 5/2011 | Minick ................. F24S 30/455 |
| | | 126/600 |
| 2012/0199175 A1 | 8/2012 | Koningstein |
| 2013/0056614 A1* | 3/2013 | Balachandreswaran ..................... |
| | | G01J 1/0242 |
| | | 250/203.4 |
| 2014/0054433 A1* | 2/2014 | Reisch ................... F24S 25/10 |
| | | 248/371 |

OTHER PUBLICATIONS

International Search Report, PCT/US2015/065382, dated May 4, 2016, 3 pages.
International Search Report, Appl. No. 15866905.1, dated Jul. 12, 2018, 1 page.

* cited by examiner

ARTICULATING JOINT SOLAR PANEL ARRAY

CROSS REFERENCE TO RELATED APPLICATIONS

This application claims benefit of priority to PCT Patent Application PCT/US2015/065382 titled "Articulating Joint Solar Panel Array" and filed in the U.S. Patent & Trademark Office on Dec. 11, 2015. PCT/US2015/065382 claims benefit of priority to U.S. Provisional Application No. 62/091,385, filed Dec. 12, 2014. Both of these applications are incorporated herein by reference in their entirety.

BACKGROUND OF THE INVENTION

An area of ongoing research and development is solar energy. In particular solar farms containing a large number of solar panel arrays have been developed. Two types of mounting systems are widely used for mounting solar panels. Fixed tilt solar panel array mounting structures account for 66% of utility-scale solar panel installations today. Fixed tilt panel mounting structures are advantageous in that they require little to no grading in order to install them. Fixed tilt solar panel mounting structures are disadvantageous in that they do not rotate the panels to follow the movement of the sun to increase the amount of power the solar panels generate. Single axis tracker solar panel mounting structures account for 33% of utility-scale solar panel installations today. Single axis tracker solar panel mounting structures are advantageous in that they rotate the panels to follow the movement of the sun to increase the maximum quantity of power the solar panels generate. Single axis tracker solar panel mounting structures are disadvantageous in that they require significant grading and a relatively flat parcel of land in order to install them. There therefore exists a need for a solar panel mounting structure that can be installed on sloped and rolling terrain and rotate solar panels in order to increase the amount of power that the solar panels generate.

Other limitations of the relevant art will become apparent to those of skill in the art upon a reading of the specification and a study of the drawings.

SUMMARY OF THE INVENTION

The following implementations and aspects thereof are described and illustrated in conjunction with system, tools, and methods that are meant to be exemplary and illustrative, not necessarily limiting in the scope. In various implementations one or more of the above-described problems have been addressed, while other implementations are directed to other improvements.

In various implementations, articulating joint solar panel single axis tracker mounting structures and systems and methods for controlling positioning of the articulating joint solar panel mounting structures. A solar panel mounting structure may include an articulating joint that may provide flexibility in how solar panels are arranged within a system. This may advantageously permit the solar panels to be easily arranged on various types of terrain or terrain with different grades. This flexibility may allow solar panel power plants to be distributed to a wider range of locations and at desired densities. An articulating joint may permit solar panel supports to be arranged at varying orientations relative to one another. The articulating joint may also permit rotation of a first solar panel support to be conveyed to a second solar panel support, which may allow for desired tracking properties for corresponding solar panels.

An aspect of the invention is directed to a solar panel assembly comprising: a first solar panel support configured to support a first solar panel capable of rotating about at least one axis; a second solar panel support configured to support a second solar panel capable of rotating about at least one axis; and an articulating joint configured to connect the first solar panel support and the second solar panel support in a manner that permits a variable orientation of the first solar panel support relative to the second solar panel support.

Further aspects of the invention may be directed to an articulating joint for connecting a plurality of solar panel supports, said joint comprising: a first interface configured to couple to a first solar panel support configured to support a first solar panel capable of rotating about at least one axis; and a second interface configured to couple to a second solar panel support configured to support a second solar panel capable of rotating about at least one axis, wherein the first and second interfaces are configured to permit variable orientation of the first solar panel support relative to the second solar panel support.

A method for controlling movement of solar panels within a solar panel assembly may be provided in accordance with an additional aspect of the invention. The method may comprise: providing a first solar panel support configured to support a first solar panel capable of rotating about at least one axis; providing a second solar panel support configured to support a second solar panel capable of rotating about at least one axis; and connecting the first solar panel support and the second solar panel support using an articulating joint that permits a variable orientation of the first solar panel support relative to the second solar panel support.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

DETAILED DESCRIPTION OF THE INVENTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

A solar panel array may be provided, which may be used to transform solar energy into electrical energy. The solar panel array may include one or more solar panels that may be supported using one or more solar panel support structures. The solar panels may move, which may allow for effective capture of solar energy. A solar panel array may include an articulating joint that may permit variation in how the solar panel support structures are arranged. This may allow for the accommodation of different types of terrain or land formations on which the solar panel array may be disposed.

A solar panel array control system may be provided, which may control operation of one or more solar panels in the solar array. Operation of the one or more solar panels may include positioning of the one or more solar panels. For example, the solar panel array control system may control an orientation of one or more solar panels. The control system may send signals to a solar panel supporting structure, which may affect the position of the one or more solar panels. The articulating joint may be capable of allowing a position of a solar panel to be controlled from the control system.

Figure 1:
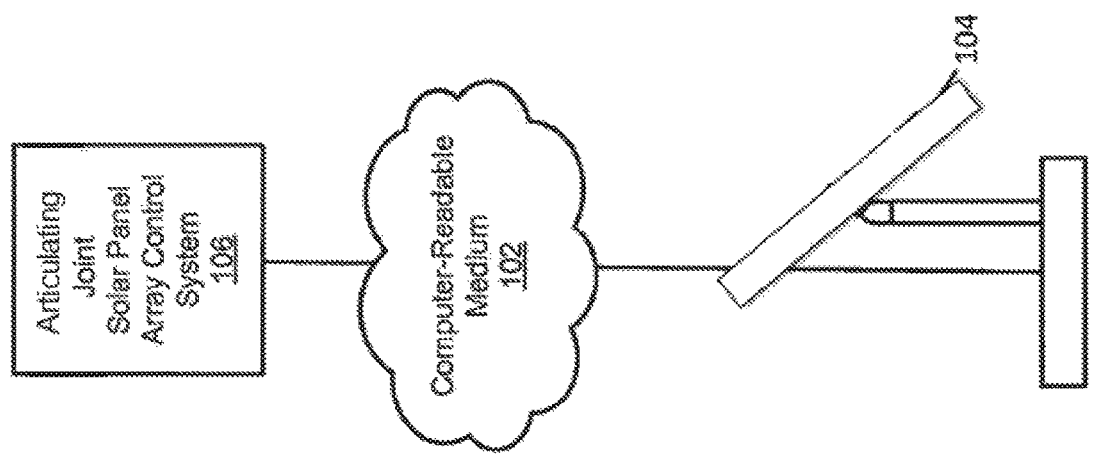
FIG. 1 depicts a diagram of an example of a system for controlling an articulating joint solar panel array.

FIG. 1 depicts a diagram of an example of a system for controlling an articulating joint solar panel array. The system of the example of FIG. 1 may include a computer-readable medium 102, an articulating joint solar panel array 104, and an articulating joint solar panel array control system 106.

In the example system shown in FIG. 1, the articulating joint solar panel array 104 and the articulating joint solar panel array control system 106 are coupled to each other through the computer-readable medium 102. The computer-readable medium may be non-transitory computer readable medium or tangible computer readable medium. Known statutory computer-readable mediums include hardware (e.g., registers, random access memory (RAM), non-volatile (NV) storage, to name a few), but may or may not be limited to hardware. The computer readable medium may comprise code, logic or instructions for performing one or more steps that may be described elsewhere herein.

The computer-readable medium 102 may represent a variety of potentially applicable technologies. For example, the computer-readable medium 102 can be used to form a network or part of a network. Where two components are co-located on a device, the computer-readable medium 102 can include a bus or other data conduit or plane. Where a first component is co-located on one device and a second component is located on a different device, the computer-readable medium 102 can include a wireless or wired back-end network or LAN. The computer-readable medium 102 can also encompass a relevant portion of a WAN or other network, if applicable. Depending upon implementation-specific or other considerations, the computer-readable medium 102 can include a portion of an applicable low power wireless mesh network, such as ZigBee® which is based on the IEEE 802.15.4 standard, hereby incorporated by reference.

The computer-readable medium 102, the articulating joint solar panel array control system 106, and any other systems or devices described in this paper can be implemented as a computer system of parts of a computer system or a plurality of computer systems. A computer system may include a processor, memory, non-volatile storage, and an interface. A typical computer system may include at least one or more of the following: a processor, memory, a general-purpose central processing unit (CPU), such as a microprocessor, or a special-purpose processor, such as a microcontroller.

The memory can include, by way of example but not limitation, random access memory (RAM), such as dynamic RAM (DRAM) and static RAM (SRAM). The memory can be local, remote, or distributed. The bus can also couple the processor to non-volatile storage. The non-volatile storage is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software on the computer system. The non-volatile storage can be local, remote, or distributed. The non-volatile storage is optional because systems can be created with all applicable data available in memory.

Software may be stored in the non-volatile storage. Indeed, for large programs, it may not even be possible to store the entire program in the memory. Nevertheless, it should be understood that for software to run, if necessary, it is moved to a computer-readable location appropriate for processing, and for illustrative purposes, that location is referred to as the memory in this paper. Even when software is moved to the memory for execution, the processor may make use of hardware registers to store values associated with the software, and local cache that, ideally, serves to speed up execution. A software program may be assumed to be stored at an applicable known or convenient location (from non-volatile storage to hardware registers) when the software program is referred to as "implemented in a computer-readable storage medium." A processor is considered to be "configured to execute a program" when at least one value associated with the program is stored in a register readable by the processor.

In one example of operation, a computer system can be controlled by operating system software, which is a software program that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux operating system and its associated file management system. The file management system may be stored in the non-volatile storage and causes the processor to execute the various acts required by the operating system to input and output data and to store data in the memory, including storing files on the non-volatile storage.

The bus can also couple the processor to the interface. The interface can include one or more input and/or output (I/O) devices. The I/O devices can include, by way of example but not limitation, a keyboard, a mouse or other pointing device, disk drives, printers, a scanner, and other I/O devices, including a display device. The display device can include, by way of example but not limitation, a cathode ray tube (CRT), liquid crystal display (LCD), or some other applicable known or convenient display device. The interface can include one or more of a modem or network interface. It will be appreciated that a modem or network interface can be considered to be part of the computer system. The interface can include an analog modem, isdn modem, cable modem, token ring interface, satellite transmission interface (e.g. "direct PC"), or other interfaces for coupling a computer system to other computer systems. Interfaces enable computer systems and other devices to be coupled together in a network.

The computer systems can be compatible with or implemented as part of or through a cloud-based computing system. As used in this paper, a cloud-based computing system is a system that provides virtualized computing resources, software and/or information to client devices. The computing resources, software and/or information can be virtualized by maintaining centralized services and resources that the edge devices can access over a communication interface, such as a network. "Cloud" may be a marketing term and for the purposes of this paper can include any of the networks described herein. The cloud-based computing system can involve a subscription for services or use a utility pricing model. Users can access the protocols of the cloud-based computing system through a web browser or other container application located on their client device.

A computer system can be implemented as an engine, as part of an engine or through multiple engines. As used in this paper, an engine includes at least two components: 1) a dedicated or shared processor and 2) hardware, firmware, and/or software modules that are executed by the processor. Depending upon implementation-specific or other considerations, an engine can be centralized or its functionality distributed. An engine can include special purpose hardware, firmware, or software embodied in a computer-readable medium for execution by the processor. The processor may transform data into new data using implemented data structures and methods, such as is described with reference to the FIGS. in this paper.

The engines described herein, or the engines through which the systems and devices described herein can be implemented, can be cloud-based engines. A cloud-based engine may be an engine that can run applications and/or functionalities using a cloud-based computing system. All or portions of the applications and/or functionalities can be distributed across multiple computing devices, and need not be restricted to only one computing device. In some embodiments, the cloud-based engines can execute functionalities and/or modules that end users access through a web browser or container application without having the functionalities and/or modules installed locally on the end-users' computing devices.

Datastores may include repositories having any applicable organization of data, including tables, comma-separated values (CSV) files, traditional databases (e.g., SQL), or other applicable known or convenient organizational formats. Datastores can be implemented, for example, as software embodied in a physical computer-readable medium on a specific-purpose machine, in firmware, in hardware, in a combination thereof, or in an applicable known or convenient device or system. Datastore-associated components, such as database interfaces, can be considered "part of" a datastore, part of some other system component, or a combination thereof, though the physical location and other characteristics of datastore-associated components is not critical for an understanding of the techniques described herein.

Datastores can include data structures. A data structure may be associated with a particular way of storing and organizing data in a computer so that it can be used efficiently within a given context. Data structures may be based on the ability of a computer to fetch and store data at any place in its memory, specified by an address, a bit string that can be itself stored in memory and manipulated by the program. Thus, some data structures are based on computing the addresses of data items with arithmetic operations; while other data structures are based on storing addresses of data items within the structure itself. Many data structures use both principles, sometimes combined in non-trivial ways. The implementation of a data structure may entail writing a set of procedures that create and manipulate instances of that structure. The datastores can optionally be cloud-based datastores. A cloud-based datastore may be a datastore that is compatible with cloud-based computing systems and engines.

The articulating joint solar panel array 104 includes a bearing about which a solar panel array mounted on a solar panel support can be displaced. The solar panel support, may have any configuration, such as a transverse beam, transverse tube, torque tube, or any other configuration. Any description herein of a transverse beam may apply to any other type of solar panel support and vice versa. The transverse beam may span the distance between first and succeeding second bearings that support the transverse beam and allow the transverse beam to rotate. A first transverse beam can be co-linear with a succeeding second transverse beam if a third succeeding bearing support is co-linear with the first and second bearings. If the third bearing support is not co-linear with the first and second bearing, then an articulating joint assembly may be used in place of a bearing to allow rotational force to be transmitted to a second transverse beam at a differing angle from the transverse beam spanning the distance between the first and second bearing. The bearings and the articulating joints may optionally be positioned at the top of a support structure, such as a support post that supports the solar panel array.

The articulating joint solar panel array 104 may include an articulating joint assembly comprised of an articulating joint and one or more bearings. The configuration of the articulating joint assembly is designed to be similar in size to a bearing design so that selecting either a bearing design or an articulating joint design will have negligible effect on the location of the solar panel support structures. Furthermore, a bearing design or an articulating joint design may be substituted for one another without the need for moving, removing or replacing solar panel structures.

Depending upon implementation-specific or other considerations, the articulating joint solar panel array 104 may be agnostic to the slope and grading of the ground that it rests upon, and thereby is less expensive to install than solar panel arrays that require grading. An articulating joint of the articulating joint solar panel array 104 can allow successive solar panel arrays to pivot about differing axes. A central axis around which a solar panel array can pivot can be an axis through the center of successive bearings in line with one another. A central axis around which a solar panel array can pivot can be an axis defined by the center of the articulating joint and the center of a succeeding or preceding articulating joint assembly or bearing. The articulating joint can be an applicable joint that allows the solar panel array to transmit torque at a differing angle to a succeeding solar panel array. Examples of an articulating joint may include, but are not limited to, a Cardan joint, constant velocity joint, spherical joint, a spherical rolling joint, a cylindrical joint, or any combination thereof.

The articulating joint solar panel array 104 can provide a solar panel array with an applicable number of degrees of freedom, including either or both translation freedom and rotation freedom. Depending upon implementation-specific or other considerations, the articulating joint can provide a solar panel array of the articulating joint solar panel array 104 with three degrees of freedom of an applicable combination of rotation freedom and/or translation freedom. Translation freedom is provided by allowing the transverse tube to freely extend and retract within the articulating joint assembly without imparting substantial load onto the articulating joint. The exact distance for extension and retraction may be determined based on environmental variables such as, but not limited to, ambient temperature variations that affect the length of the transverse tube and shifting soil that may move the base of the bearing mounting structure. One end of each transverse beam can be rigidly fixed without the ability to translate in an articulating joint. One end of each transverse beam can be selected to be rigidly fixed without the ability to translate in an articulated joint to impart load onto a specific support structure.

The articulating joint solar panel array 104 includes drive mechanisms for causing a solar panel array to be displaced about an articulating joint. Examples of applicable drive mechanisms may include motors and torque tubes. Drive mechanisms of the articulating joint solar panel array can cause a solar panel array to be displaced according to control instructions. The articulating joint solar panel array can include batteries to supply power to drive mechanisms. Power can be provided to the batteries from solar power generated by a solar panel array of the articulating joint solar panel array. Depending upon implementation-specific or other considerations, power can be supplied to the batteries during curtailment or during operation without curtailment. Curtailment, as is used in this paper, occurs when a solar power plant associated with the articulating joint solar panel array produces more power than it can inject into a power grid. Further depending upon implementation-specific or other considerations, power can be supplied to the batteries during clipping. Clipping, as is used in this paper, occurs when the articulating joint solar panel array produces more power than inverters and/or transformers coupled to the articulating joint solar panel array are rated to handle. Power can also be supplied by a dedicated solar panel or from grid power connection.

In a specific implementation, the articulating joint solar panel array 104 may include position sensing mechanisms for determining the position of the solar panel array. Positioning of each solar panel of a solar panel array may be determined. In some instances, the positioning of a representative solar panel from a group of solar panels may be determined. Position sensing mechanisms can include applicable sensors and/or instruments for determining an orientation of a solar panel array. Examples of position sensing mechanisms include gyroscopes, accelerometers, tilt sensors, photo sensors, and/or video and audio capturing instruments. Depending upon implementation-specific or other considerations, the position mechanisms can be used to determine if a solar panel array is being displaced correctly according to control instructions. For example the position sensing mechanisms can be used to control the driving mechanisms in displacing the solar panel array. Further depending upon implementation-specific or other considerations, the position sensing mechanisms can be calibrated through interactions with neighboring solar panel arrays. For example, a tilt sensor can be calibrated based on a tilt sensor of a solar panel array having a solar panel array at the same tilt.

In a specific implementation, the articulating joint solar panel array 104 may include environment sensing mechanisms for determining factors of the environment surrounding the articulating joint solar panel array. Examples of factors of an environment can include temperature, wind speed, an amount of shading of a solar panel array, and performance and/or positions of neighboring solar panel arrays. Examples of environment sensing mechanisms include thermometers, wind speed detectors, amperage meters, voltage meters, photo sensors, and/or video and audio capturing instruments. Depending upon implementation-specific or other considerations, an amount of shading of a solar panel array can be determined based on power produced by specific solar panels in the solar panel array. For example, if 50% of solar panels in a solar panel array are producing power at a level consistent with the level of power generation by modules in neighboring rows and expected by current environmental conditions and 50% are not, then it can be determined that 50% of the solar panel array is shaded to some degree. Further depending upon implementation-specific or other considerations, the environment sensing mechanisms can be used in displacing a solar panel array. For example, if a wind speed of thirty miles per hour from the south is detected, then the solar panel array can be displaced to minimize damage from the wind.

The articulating joint solar panel array control system 106 may function to control displacement of a solar panel array of the articulating joint solar panel array 104. The articulating joint solar panel array control system can control displacement of a solar panel array based on an amount of power generated by the solar panel array or other power source, in order to increase, decrease, and/or otherwise affect power generation levels of the solar panel array.

Depending upon implementation-specific or other considerations, the articulating joint solar panel array control system 106 can be dedicated to the articulating joint solar panel array 104 only, or a plurality of articulating joint solar panel arrays through a master-slave arrangement with a central controller collecting data from individual row controllers to direct the tilt of each tracker row. Further depending upon implementation-specific or other considerations, the articulating joint solar panel array control system or portions of the articulating joint solar panel array control system can be integrated as part of the articulating joint solar panel array, at the site of the articulating joint solar panel array, and/or remote from the site of the articulating joint solar panel array.

In being integrated as part of the articulating joint solar panel array 104 the articulating joint solar panel array control system 106 can be semi-autonomous. In controlling displacement of a solar panel array of the articulating joint solar panel array, the control system can send control signals to the articulating joint solar panel array that cause a drive mechanism to displace the solar panel array. Control signals can include a direction, an angle, and/or an amount to move the solar panel array.

In a specific implementation, the articulating joint solar panel array control system 106 may troubleshoot and/or perform diagnostics on the articulating joint solar panel array 104. In performing diagnostics on the articulating joint solar panel array, the articulating joint solar panel array control system can determine if the articulating joint solar panel array is working properly. Depending upon implementation-specific or other considerations, the articulating joint solar panel array control system can send a control signal to the articulating joint solar panel array to displace to pre-defined position if it determines that the articulating joint solar panel array is not working properly. An example, of a predefined position can include a fixed tilt.

In a specific implementation, the articulating joint solar panel array control system 106 may function to control displacement of a solar panel array of the articulating joint solar panel array 104 based on a position of the solar panel array, as determined by position sensing mechanisms. Depending upon implementation-specific or other considerations, the articulating joint solar panel array control system can control displacement of a solar panel array based on a desired position of the solar panel array and a current position of the solar panel array, as determined by position sensing mechanisms. For example, if the articulating joint solar panel array control system 106 determines that a solar panel array needs to be rotated 45° from its current position, then the articulating joint solar panel array control system 106 can generate and send a control signal to drive mechanisms specifying to rotate the solar panel array 45°. Further depending upon implementation-specific or other considerations, the articulating joint solar panel array control system can send a constant control signal to the driver mechanisms as the solar panel array is being displaced until the desired position of the solar panel array is achieved, as determined using the position sensing mechanisms. For example, the articulating joint solar panel array control system can send control signals to the drivers constantly to cause the drivers to continue rotating the solar panel array until a desired position of the solar panel array is achieved.

In a specific implementation, the articulating joint solar panel array control system 106 functions to control displacement of a solar panel array of the articulating joint solar panel array 104 based on factors of the environment surrounding the articulating joint solar panel array, as determined by environment sensing mechanisms. The articulating joint solar panel array control system can determine a desired position of a solar panel array based on factors of the environment surrounding the solar panel array. For example, if the articulating joint solar panel array control system determines that a solar panel array is being shaded above a threshold level, then the articulating joint solar panel array control system can determine a desired position of the solar panel array at which shading would be reduced below the threshold level. Optionally, the shade threshold level may refer to a threshold area or percentage of the area of the solar panel that is shaded, or an amount or percentage of energy production decrease due to shading. In another example, if the articulating joint solar panel array control system determines that a solar panel array is being exposed to winds greater than a threshold level, then the articulating joint solar panel array can determine a desired position at which damage from the wind will be reduced. Optionally, the wind threshold level may refer to a velocity of the wind, or an amount of force imparted on the solar panel array due to the wind.

The articulating joint solar panel array control system 106 can optionally determine a desired position of a solar panel array based on a time and geographical position. A time can include a time of day and a time during a calendar year. A geographical position can include latitude, longitude, slope, aspect and elevation. For example, if on a given day the sun tracks along a specific line with respect to a solar panel, then the articulating joint solar panel array control system can determine a desired position based on the specific line along which the sun tracks. In another example, the articulating joint solar panel array control system can determine a desired position of a solar panel array based on the location of the sun at a given time of day.

In some instances, the articulating joint solar panel array control system 106 can determine a desired position of a solar panel array based on historical data. In using historic data to determine a desired position of a solar panel array, the articulating joint solar panel array control system can determine if power production anomalies exist. For example, the articulating joint solar panel array can determine a power production anomaly exists if a specific solar panel array experiences reduced power production according to a pattern, such as around the same time of day every day. If a power production anomaly is discovered, the articulating joint solar panel array control system can determine a desired position that reduces or eliminates the power production anomaly.

In accordance with some implementations, the articulating joint solar panel array control system 106 can determine a desired position of a solar panel array at a site based on positions of other solar panel arrays on the site. For example, if the articulating joint solar panel array control system can determine a desired position of a solar panel array where it will not be shaded by another solar panel array on the site based on the position of another solar panel array on the site.

In accordance with some implementations, the articulating joint solar panel array control systems 106 can determine the desired positions of a plurality of solar panel arrays to increase or maximize power generation based on power generation analysis that may result in the intentional shading of certain solar panel array(s) to increase the power generation of other solar panel arrays at a greater amount than the loss associated with the shaded array(s). For example, if a solar panel array is being shaded thus reducing power generation of the entire power plant by 0.1%, but the shading mitigation measures for eliminating shading from the one solar panel array requires all other solar panel arrays to be tilted further from the sun resulting in an overall power generation reduction of 2%, then it may be determined that it is preferable to shade the one solar panel array at that period of time.

In a specific implementation, the articulating joint solar panel array control system 106 can control the positions of a plurality of solar panel arrays at a site. Depending upon implementation-specific or other considerations, the articulating joint solar panel array control system can control the positions of a plurality of solar panel arrays within a row, thereby being row specific, within a column, thereby being column specific, and/or within a region, thereby being region specific. Further depending upon implementation-specific or other considerations, articulating joint solar panel arrays can communicate with each other, e.g. send position data, through the articulating joint solar panel array control system. Depending upon implementation-specific or other considerations, the articulating joint solar panel array control system can position a plurality of solar panel arrays at a site in order to increase, decrease, and/or otherwise affect power generation levels of the solar panel arrays at the site. For example, the articulating joint solar panel array control system can cause all solar panel arrays within a row to move in order to increase power production by solar panel arrays in another row.

Figure 2:
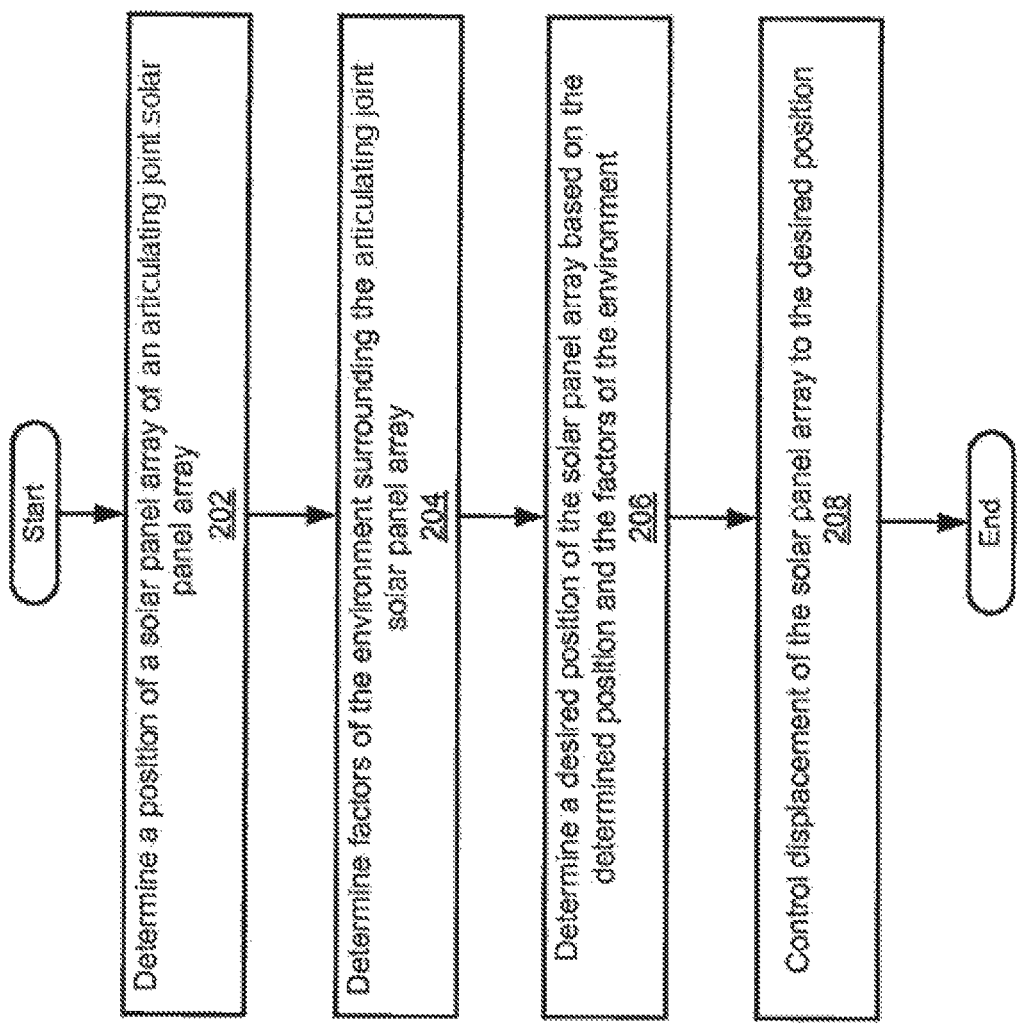
FIG. 2 depicts a flowchart of an example of a method for controlling displacement of a solar panel array of an articulating joint solar panel array.

FIG. 2 depicts a flowchart of an example of a method for controlling displacement of a solar panel array of an articulating joint solar panel array. Any of the steps of the flowchart may be optional and/or exchanged for other steps. In some instances, steps may be removed, added, or order of the steps may be altered.

The flowchart begins at module 202, where a position of a solar panel array of an articulating joint solar panel array is determined. A position of a solar panel array can be determined by position sensing mechanisms of an articulating joint solar panel array.

The flowchart continues to module 204, where factors of the environment surrounding the articulating solar panel array are determined. Factors of the environment surrounding the articulating solar panel array can be determined by environment sensing mechanisms and/or based on an amount of power generated by specific panels within the solar panel array. Depending upon implementation-specific or other considerations, a factor of the environment can include an amount of shading of the solar panel array.

The flowchart continues to module 206 where a desired position of the solar panel array is determined based on the determined position of the solar panel array and the factors of the environment surrounding the articulating joint solar panel array. Depending upon implementation-specific or other considerations, a desired position of the solar panel array is a position of the solar panel array where shading of the solar panel array is reduced.

The flowchart continues to module 208 where displacement of the solar panel array to the desired position is controlled. The solar panel array can be displaced to the desired position through pivoting of the solar panel array about a rotation axis defined by bearings and/or an articulating joint. In using an articulating joint the solar panel array can be displaced along a plurality of axes and/or rotated.

Figure 3:
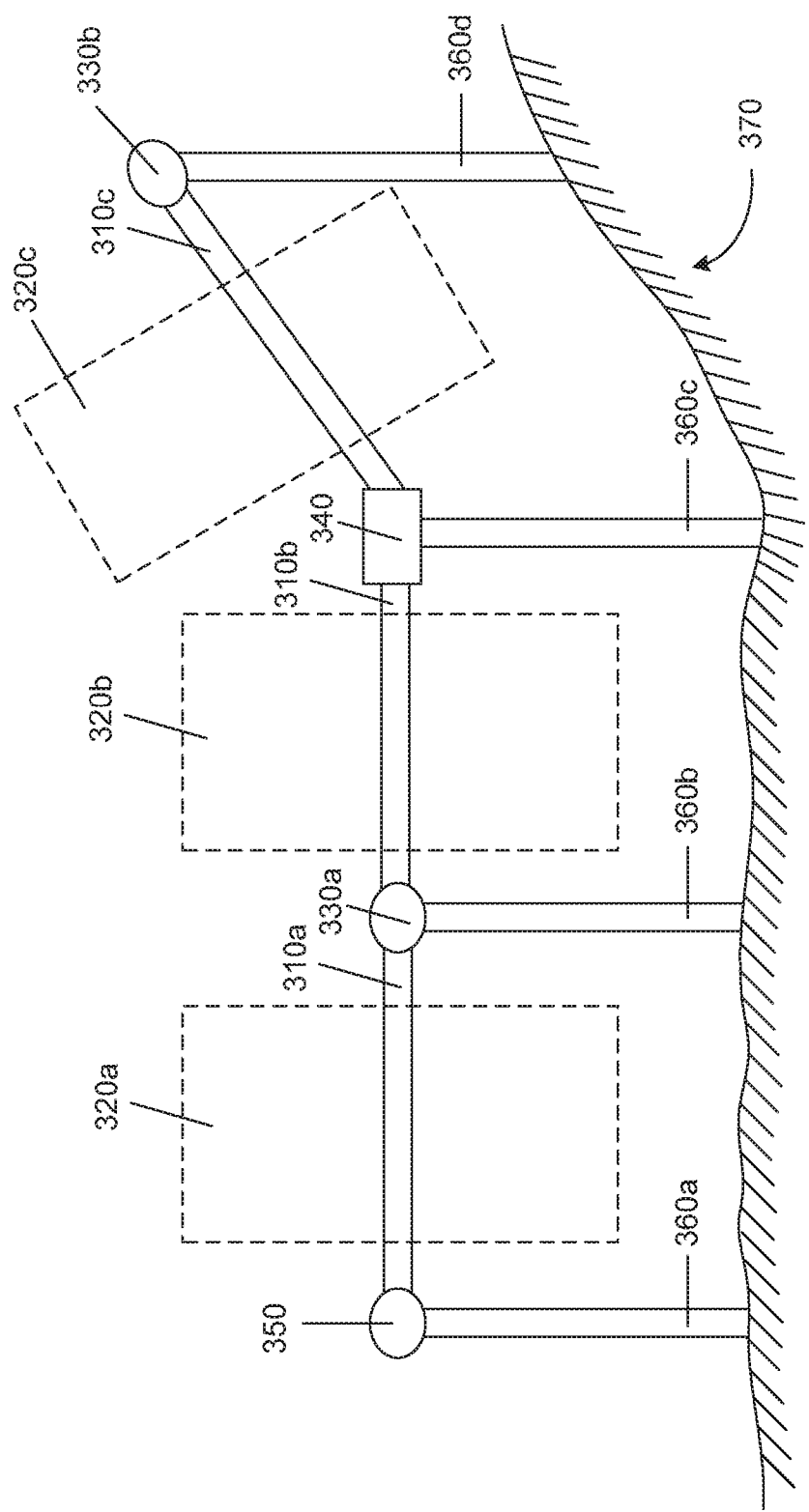
FIG. 3 depicts a schematic of a solar panel array within an environment.

FIG. 3 depicts a schematic of a solar panel array within an environment. One or more solar panel supports 310a, 310b, 310c may be provided, which may support one or more solar panels 320a, 320b, 320c. In some embodiments, the solar panel supports may be connected via one or more bearings 330a, 330b. Optionally, an articulating joint 340 may be used to connect the solar panel supports. A driving mechanism 350 may drive movement of the one or more solar panels. One or more support structures 360a, 360b, 360c may be provided which may support the solar panel supports, bearings, and/or articulating joint over an underlying surface 370.

A solar panel array may include one or more solar panel supports 310a, 310b, 310c. The solar panel supports may bear weight of one or more solar panels 320a, 320b, 320c. In some instances, a one-to-one correspondence may be provided so that each solar panel support bears weight of one solar panel. Alternatively, a single solar panel support may bear weight of multiple solar panels, or multiple solar panel supports may be used to bear weight of a single solar panel. A solar panel support may support one or more corresponding solar panels.

The solar panel supports may be configured to span a length. A solar panel support may span a length between two end-supports. Examples of end-supports may include, but are not limited to, bearings, articulating joints, driving mechanisms, support structures, or any other structure that may support an end of a solar panel support. The end-supports at both ends of the solar panel support may be the same type, or may be different types. The end-supports may be at the ends of the solar panel supports, or near an end of the solar panel supports (e.g., within 20%, 10%, 5%, 3%, or 1% of an end of the solar panel supports).

The solar panel support may have any shape or configuration. For instance, a solar panel support may be a transverse beam, transverse tube, and/or torque tube. The solar panel support may have an elongated shape such that the length of the solar panel support exceeds a dimension, such as a length, diagonal, diameter, or width, of a cross-section of solar panel support. In some instances, the length of the solar panel support exceeds the dimension of the cross-section of the solar panel support by more than 1:1, 3:2, 2:1, 3:1, 4:1, 5:1, 6:1, 8:1, 10:1, 15:1, 20:1, 30:1, or 40:1. In some instances, the length of the solar panel support may be on the order of an inch, several inches, tens of inches, feet, several feet, or tens of feet. The cross-section of the solar panel support may have any shape, including but not limited to, a circle, ellipse, oval, square, rectangle, trapezoid, pentagon, hexagon, octagon, crescent, "I" shape, "T" shape, "H" shape, "X" shape, or any other shape, which may include a regular or irregular polygon. The solar panel support may have a solid structure, or may have a hollow structure. The solar panel support may or may not have one or more cavities therein.

One or more solar panels 320a, 320b, 320c may be provided in a solar panel array. The solar panels may include one or more photovoltaic ("PV") cells that may be capable of converting solar energy to electrical energy. The PV cells may be arranged in any configuration on a solar panel. For instance, an array of PV cells may be provided on a solar panel. The solar panel may include a cover or protective surface. The solar panel may include a frame.

The solar panel may have any shape or configuration. For instance, the solar panel may have a quadrilateral shape, such as a rectangle or square. The solar panel may have any other shape, as described elsewhere herein. The solar panel may have a dimension (e.g., length, width, diagonal, diameter) on the order of an inch, several inches, tens of inches, feet, several feet, or tens of feet.

A solar panel may be capable of moving. For instance, the solar panel may be capable of rotating about one, two, or three axes. The solar panel may be capable of translation along one, two, or three axes. The axes may or may not be orthogonal to one another. In some instances, the movement of a solar panel may be determined by a corresponding solar panel support. Movement of the solar panel support may effect movement of the corresponding solar panel. For instance, rotation of a solar panel support or a component of the solar panel support may cause the corresponding solar panel to rotate about the same axis. Translation (e.g., sliding) of the solar panel support or a component of the solar panel support may cause the corresponding panel to translate (e.g., slide) along the same axis. In one example, rotation of a first solar panel support 310a may cause a corresponding rotation of a first solar panel 320a, rotation of a second solar panel support 310b may cause a corresponding rotation of a second solar panel 320b, and/or a rotation of a third solar panel support 310c may cause a corresponding rotation of a third solar panel 320c.

One or more bearings 330a, 330b may optionally be provided within a solar panel array. A bearing may connect one or more solar panel supports. For instance, a bearing 330a may connect a first solar panel support 310a and a second solar panel support 310b. The bearing may support ends of the solar panel supports. The bearing may permit rotation of a first solar panel support to affect rotation of a second solar panel support. In some instances, rotation of the first solar panel support would cause rotation of the second solar panel support. The rotation of the first solar panel support may be imparted to the second solar panel support to cause rotation of the second solar panel support. The rotation of the first solar panel support and the second solar panel support may be at the same rate or may be at differing rates. The first solar panel support and the second solar panel support may or may not directly contact one another. In some instances, the bearing may form the connection between the first solar panel support and the second solar panel support.

The bearing may optionally cause the first solar panel support and the second solar panel support to retain the same orientation relative to one another. The position between the first solar panel support and the second solar panel support may be substantially fixed when a bearing connects them. For instance, a length of the first solar panel support may be co-linear with the second solar panel support. If the solar panel supports are a tube or beam, the solar panel supports may be co-linear with one another. Bearings may be useful in situations where the terrain is relatively flat, or there is relatively little variation.

The solar panel array may include an articulating joint 340. The articulating joint may connect one or more solar panel supports. For instance, an articulating joint may connect a first solar panel support 310b and a second solar panel support 310c. The articulating joint may support ends of the solar panel supports. The articulating joint may permit rotation of a first solar panel support to affect rotation of a second solar panel support. In some instances, rotation of the first solar panel support would cause rotation of the second solar panel support. The rotation of the first solar panel support may be imparted to the second solar panel support to cause rotation of the second solar panel support. The rotation of the first solar panel support and the second solar panel support may be at the same rate or may be at differing rates. The first solar panel support and the second solar panel support may or may not directly contact one another. In some instances, the articulating joint may form the connection between the first solar panel support and the second solar panel support.

The articulating joint may permit the first solar panel support and the second solar panel support to have variable orientations relative to one another. Correspondingly, the articulating joint may permit the first solar panel and the second solar panel to have variable orientations relative to one another. Any description herein of variation in the positioning of the solar panel supports and/or orientations of the solar panel supports may also apply to corresponding solar panels, and vice versa. The position between the first solar panel support and the second solar panel support may be substantially variable when an articulating joint connects them. In some instances, the orientation of the first solar panel support and the second solar panel support may be varied while the solar panel array is being set up. The orientation of the first solar panel support and the second solar panel support may or may not be altered after the solar panel array is set up. The first solar panel support and the second solar panel support may be arranged so that they are at different orientations relative to one another (e.g., not co-linear), with aid of the articulating joint. Optionally, the first solar panel support and the second solar panel support may be arranged so that they are at the same orientation relative to one another (e.g., co-linear). The solar panel supports may be arranged to not be co-linear with one another on an X plane and/or Y plane. They may be arranged to be not co-linear at an angle of less than 1, 5, 15, 30, 60, or 90 degrees. Optionally, they may be arranged at an angle of less than 1 degree, 1 degree, or up to degrees conically with a maximum absolute angle of up to 90 degrees from horizontal. However, the articulating joint may permit the first solar panel support and the second solar panel support to be arranged in an orientation at a user's discretion. A user may select from a wide range of configurations.

Articulating joints may be useful in situations where the terrain is not flat, or when there is substantial variation. For instance, as illustrated, when the terrain 370 has a change in grade, the articulating joint 340 may be employed to permit the solar panel array to accommodate the change in terrain. This may cause the first solar panel support 310b and the second solar panel support 310c to be at different orientations relative to one another. For instance, an axis extending through the length of the first solar panel support is not parallel to an axis extending through the length of the second solar panel support.

The rotation of the first solar panel support may affect the rotation of the second solar panel support through the articulating joint, regardless of whether the first solar panel support and the second solar panel support are arranged at different orientations or the same orientation. For instance, the rotation of the first solar panel support 310b may cause or affect the rotation of the second solar panel support 310c even when they are at different orientations relative to one another, with aid of the articulating joint 340. The articulating joint may permit a rotational force from the first solar panel support to be transferred to the second solar panel support. The rotational force may permit rotation in an unlimited range, or within a limited range. In one instance, the articulating joint may permit a rotational force from the first solar panel support to be transferred to the second solar panel support for up to 15, 30, 45, 60, 75, 90, 120, 150, or 180 degrees (optionally, in the negative or positive direction from horizontal). This may occur when the first solar panel support and the second solar panel supports are at different orientations, or at the same orientation. For instance, the articulating joint may permit a rotational force from the first solar panel support to be transferred to the second solar panel support when the first solar panel support and the second solar panel support are at different orientations relative to one another for up to 15, 30, 45, 60, 75, 90, 120, 150, or 180 degrees (optionally, in the negative or positive direction from horizontal). As previously described, the rotational force of the first solar panel support may effect rotation of the corresponding first solar panel, and rotational force of the second solar panel support may effect rotation of the corresponding second solar panel.

In some embodiments, other types of movements may occur. For instance, a solar panel may have a translational motion. The translational motion may be in a direction along a length of a corresponding solar panel support. Alternatively, the translational motion may have any other direction. In some instances, translational motion of the solar panel support may cause the corresponding translational motion in the solar panel. In one example, a solar panel support or a component of the solar panel support may move along the length of the solar panel support, which causes a corresponding motion by the solar panel in a direction parallel to the length of the solar panel support. A first solar panel support may permit translational movement of a first solar panel and a second solar panel support may permit translational movement of a second solar panel. In some instances, the translation may be of less than or equal to 1, 3, 6, 12, 24, or 36 inches. The translation may be greater than any of the values described or may fall within a range between any two of the values described. The translation may be in any direction, which may include a positive or negative Z-axis direction, positive or negative Y-axis direction, and/or a positive or negative X-axis direction. In one example, the translation may be less than one inch, one inch, or up to 12 inches in the positive or negative Z axis direction.

In some instances, the solar panel support may extend or retract to permit translational motion of the corresponding solar panel. In some instances, the solar panel support may include multiple parts that may permit the extending or retracting. For instance, one or more telescoping features may be provided. The extending or retracting may occur within one or more end-supports of the solar panel support. For instance, the extending or retracting may occur within an articulating joint, or a bearing supporting the solar panel support. In some instances, the range of the extending or retracting may be limited. The range may be limited to less than or equal to 50%, 40%, 30%, 25%, 20%, 15%, 10%, 5%, 3%, or 1% of the length of the solar panel support.

In one example, a method of imparting a translational load from a solar panel support to a bearing within the articulating joint assembly may be provided. The method may include rigidly fixing a panel support to the bearing to constrain translational motion of one or more, two or more, three or more, five or more, or ten or more panel supports onto said bearing. This method may provide an ability of focusing the translational load of one panel support onto one support structure to reduce the total load on the ultimate support structure for purposes of reducing the size and strength requirements for the support structure.

A solar panel array may include a driving mechanism 350. The driving mechanism may drive motion of one or more solar panels 320a, 320b, 320c within the solar panel array. The driving mechanism may drive motion of one or more solar panel supports 310a, 310b, 310c within the solar panel array. The motion may include rotational motion and/or translational motion.

The driving mechanism 350 may drive a motion of a first solar panel support 310a that is closest to the driving mechanism, which may in turn drive a motion of a subsequent second solar panel support 310b further from the driving mechanism. Optionally the motion of the second solar panel support may in turn drive a motion of a subsequent third solar panel support 310c even further from the driving mechanism. The motion of the first solar panel support may drive the motion of the first solar panel, the motion of the second solar panel support may drive the motion of the second solar panel, and/or the motion of the third solar panel support may drive the motion of the third solar panel. In some examples, the motion of the first solar panel may drive the motion of the second solar panel support with aid of an end-support, such as a bearing or articulating joint. Similarly, the motion of the second solar panel support may drive the motion of the third solar panel support with aid of an end-support, such as a bearing or articulating joint. The end-support itself may or may not move. In some instances, the motion of a solar panel may drive a motion of a portion of the end support (e.g., bearing or articulating joint) that may in turn drive a motion of a subsequent solar panel support.

The driving mechanism may affect motion of any number of solar panels and/or solar panel supports. The driving mechanism may affect motion of at least 1 or more, 2 or more, 3 or more, 4 or more, 5 or more, 6 or more, 7 or more, 8 or more, 9 or more, 10 or more, 15 or more, 20 or more, 30 or more, or 50 or more solar panels and/or solar panel supports. The solar panels and/or solar panel supports may be arranged serially, in parallel, or any combination of the two.

The driving mechanism may include an actuator that may affect the motion of the solar panel array. The actuator may include a motor. The driving mechanism may have any characteristics or features as described elsewhere herein.

One or more components of the solar panel array may be raised above an underlying surface 370. One or more support structures 360a, 360b, 360c, 360d may elevate one or more components of the solar panel array. For instance, one or more end-supports (e.g., bearings, articulating joints, driving mechanisms) may be raised above the underlying surface with aid of one or more support structures. The one or more solar panel supports may be raised above the surface with aid of the one or more support structures. The one or more support structures may or may not directly contact the one or more solar panel supports. In some instances, the one or more support structures may directly contact the end-supports, which may in turn support the one or more solar panel supports.

The one or more support structures 360a, 360b, 360c, 360d may sufficiently elevate the components of the solar panel array such that the solar panels 320a, 320b, 320c are raised above the underlying surface and are high above enough the surface to not come into contact with the surface even when the solar panels rotate.

The support structures 360a, 360b, 360c may have any configuration. For instance, the support structures may form support posts. The support posts may have a substantially vertical orientation that may raise the end-supports of the solar panel array. Any other configuration may be provided by the support structures. For instance, framing, walls, trusses, beams, or any other configuration may be provided. The support structures may have a substantially fixed length. Alternatively, the support structures may have a variable length. The support structures may have a component that may permit extension or retraction of a component of the support structures. Telescoping features may be provided that may permit variability in the support structure length. The support structures may optionally be affixed to the underlying surface. For instance, the support structure may penetrate an underlying ground.

The solar panel array, or a portion of a solar panel array, may be presented as a row of solar panels with corresponding supporting structure. The solar panels may be arranged so that they in straight rows, or can be in rows that change direction. One or more articulating joints in the array may permit lateral variability in the orientation of the solar panel supports, that may permit the rows of the solar panel array to not be perfectly straight laterally. In some instances, the articulating joints may permit the solar panel array to vary by at least 1, 3, 5, 10, 15, 30, 45, 60, 75, 90, 105, 120, 135, 150, 165, or 175 degrees laterally at each articulating joint, or over multiple articulating joints. Similarly, the solar panels may be arranged in rows that may traverse terrain with changing elevation or grades. One or more articulating joints in the array may permit vertical variability in the orientation of the solar panel supports, which may permit rows of the solar panel array to not all be straight vertically. In some instances, the articulating joints may permit the solar panel array to vary by at least 1, 3, 5, 10, 15, 30, 45, 60, 75, or 85 degrees vertically at each articulating joint, or over multiple articulating joints. The articulating joint may be able to accommodate at least a 1%, 5%, 10%, 20%, 30%, 40%, 50%, 60%, 70%, 80%, 90%, or 100% change in grade of the underlying surface. An articulating joint may be configured to connect to a first solar panel support and a second solar panel support in a manner that permits a variable orientation of the first solar panel relative to the second solar panel support. The variable orientation may be provided with a maximum nominal slope of any degree, such as any degree value described elsewhere herein. For instance, the maximum nominal slope may be of at least 1, 3, 5, 10, 15, 30, 45, 60, 75, 85, 90, 105, 120, 135, 150, 165, or 175 in any direction. The maximum nominal slope may be less than any of the degree values provided or may fall within a range between any two of the degree values provided.

Figure 4:
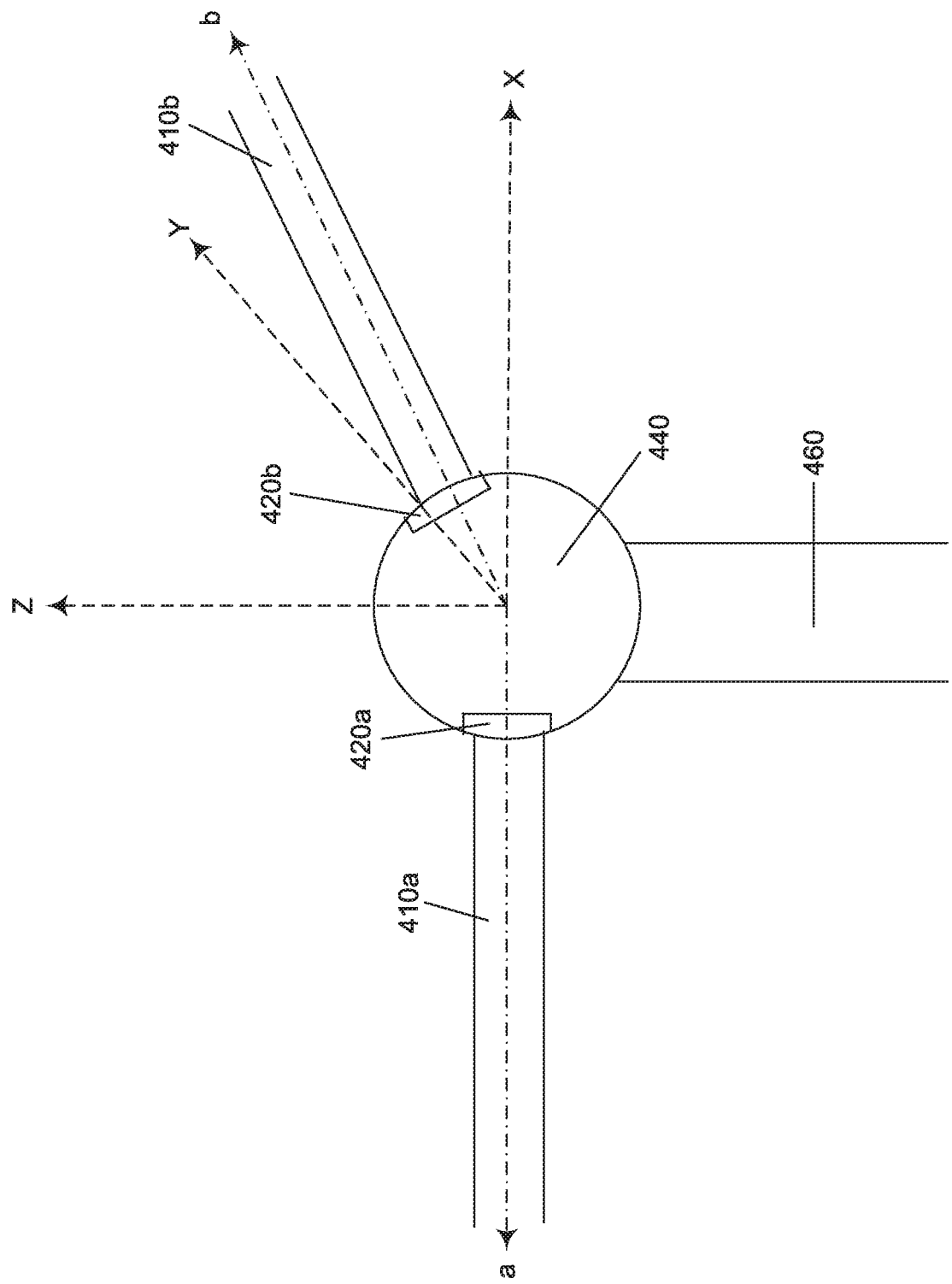
FIG. 4 shows a schematic of degrees of freedom for an articulating joint.

FIG. 4 shows a schematic of degrees of freedom for an articulating joint. An articulating joint 440 may have a first interface 420a that couples to a first solar panel support 410a, and a second interface 420b that couples to a second solar panel support 410b. Optionally, the articulating joint may be supported by a support structure 460.

The articulating joint 440 may be used to connect two or more solar panel supports. In the illustration provided, a first interface 420a and a second interface 420b may be provided. However, the articulating joint may have any number of interfaces that may correspond to any number of solar panel supports that may be supported by the articulating joint. For instance, the articulating joint may be used to support 1 or more, 2 or more, 3 or more, 4 or more, 5 or more, or 10 or more solar panel supports, and/or may have 1 or more, 2 or more, 3 or more, 4 or more, 5 or more, or 10 or more corresponding interfaces. The interfaces may have fixed positions (e.g., spatial locations or orientations) relative to one another. Alternatively, the interfaces may have variable positions (e.g., spatial locations or orientations) relative to one another. The interfaces may or may not be able to move relative to one another.

A solar panel support may couple to an articulating joint interface. The solar panel support may directly contact an articulating joint interface. The articulating joint interface may or may not permit movement or expansion/retraction of the solar panel support relative to the articulating joint. An end of the solar panel support may be stopped by the articulating joint interface. Alternatively, the articulating joint interface may permit the end of the solar panel support to pass through and/or move within the articulating joint.

A solar panel support may have a rotational motion. The rotational motion of the solar panel support may cause a corresponding rotation by the articulating joint interface coupled to the solar panel support. Alternatively, the solar panel support may rotate relative to the articulating joint interface. In some embodiments, rotation of the first solar panel support may cause rotation of the first articulating joint interface, which may cause rotation of a second articulating joint interface, which may in turn cause rotation of a second solar panel support. In some instances, the articulating joint may cause the rotation of the second solar panel support to match the rotation of the first solar panel support. The articulating joint may cause the rate of rotation and/or acceleration of rotation of the second solar panel support to match the rate of rotation and/or acceleration of rotation of the first solar panel support. Alternatively, the rotation, rate of rotation, and/or acceleration of rotation of the first solar panel support may be different from the second solar panel support (e.g., may be less than or greater than). In some instances, the articulating joint may impose a factor (e.g., 1, 1.1, 1.2, 1.3, 1.5, 2, 3, etc.) between rotation of the first solar panel support and the second solar panel support.

As previously described, the articulating joint may permit an orientation of a first solar panel support 410a and a second solar panel support 410b to be variable relative to one another. The orientation of the first end support a may be an axis extending along a length of the first solar panel support and an orientation of the second solar panel support b may be an axis extending along a length of the second solar panel support. When the first solar panel support and the second solar panel support are co-linear, a and b may be parallel, or may coincide. When the first solar panel support and the second solar panel support are not co-linear, a and b are not parallel. The articulating joint may permit a and b to have variable orientations relative to one another. The articulating joint may permit a and b to not be parallel. The articulating joint may permit the angle between a and b to vary by greater than, less than, or equal to 1 degree, 3 degrees, 5 degrees, 10 degrees, 15 degrees, 30 degrees, 45 degrees, 60 degrees, 75 degrees, 90 degrees, 105 degrees, 120 degrees, 135 degrees, 150 degrees, 160 degrees, 170 degrees, 175 degrees, 178 degrees, or 179 degrees. The angle between a and b may be anywhere in three dimensional space. The angle may be provided relative to an x-y plane, y-z plane, or x-z plane. Components of the angles may be found along an x-axis, y-axis, and/or z-axis.

In some instances, the articulating joint may permit variability along three degrees of freedom (e.g., at least three degrees of rotational freedom). For instance, the orientation of the first solar panel support and the second solar panel support may differ relative to the x-axis, y-axis, and z-axis as illustrated. The articulating joint may permit variation in the orientation of the first solar panel support relative to the second solar panel support about at least three degrees of rotational freedom while the solar panel array is being set up. The variation may or may not be permitted after the solar panel array has been finished setting up and is being used to convert solar energy to electrical energy. In other embodiments, the articulating joint may permit variability under fewer degrees of freedom, such as one degree of freedom, or two degrees of freedom. In one example, the articulating joint may permit variability in a vertical direction but not in a lateral direction. In another example, the articulating joint may permit variability in a lateral direction but not in a vertical direction.

In some instances, the articulating joint may permit variability along three degrees of freedom (e.g., at least three degrees of translational freedom). For instance, the spatial disposition of the first solar panel support and the second solar panel support may differ relative to the x-axis, y-axis, and z-axis as illustrated. The articulating joint may permit variation in the spatial location of the first solar panel support relative to the second solar panel support about at least three degrees of rotational freedom while the solar panel array is being set up. The variation may or may not be permitted after the solar panel array has been finished setting up and is being used to convert solar energy to electrical energy. In other embodiments, the articulating joint may permit variability under fewer degrees of freedom, such as one degree of freedom, or two degrees of freedom. In one example, the articulating joint may permit translational variability along a length of a solar panel support without permitting variability in a direction orthogonal to the length of the solar panel support.

Figure 5:
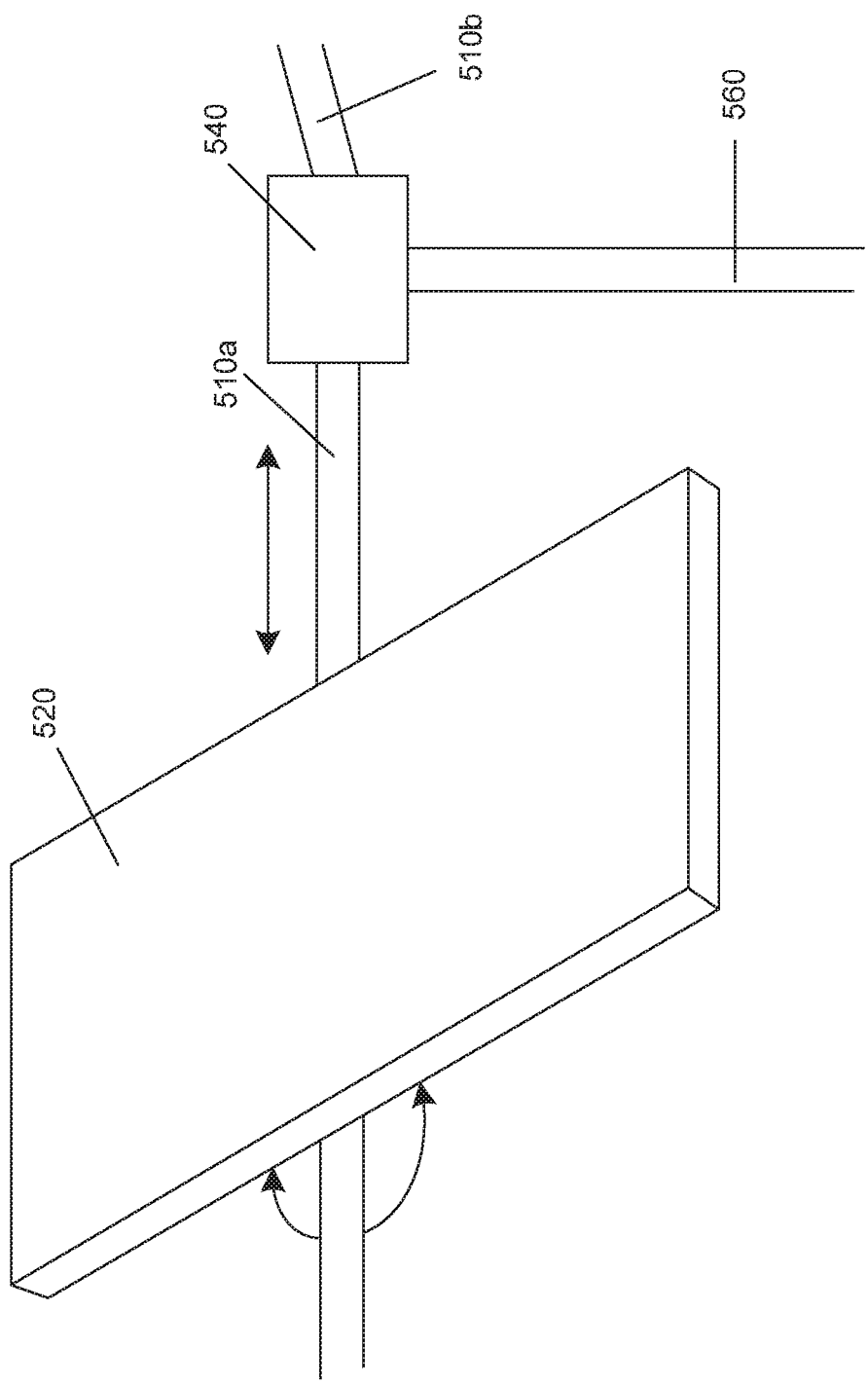
FIG. 5 shows a schematic of a solar panel with a variable position.

FIG. 5 shows a schematic of a solar panel with a variable position. A solar panel support 510a may support a weight of a solar panel 520. Optionally, an articulating joint 540 or other type of end support may connect the solar panel support 510a to another solar panel support 510b. The articulating joint or other type of end support may be raised with aid of one or more support structures 560.

The solar panel 520 may be capable of rotational motion and/or translational motion. In some instances, the solar panel may be capable of both rotational motion and translational motion.

The solar panel 520 may rotate about an axis of rotation extending through or parallel to an axis extending through a length of the solar panel support 510. When a solar panel support is laterally flat relative to an inertial reference frame (e.g., is orthogonal to a direction of gravity), the rotation of the solar panel may be about an axis of rotation that is lateral relative to the inertial reference frame. However, when the solar panel support has a vertical component relative to the inertial reference frame (e.g., is not orthogonal to the direction of gravity), the rotation of the solar panel is not limited to being lateral relative to the inertial reference frame. Even if a solar panel rotates about a single axis of rotation, the axis of rotation itself may change, which may provide a wide range of possible positions for the solar panel. The articulating joint may permit the axis of rotation of the solar panel to be variable. Optionally, the solar panel may rotate with the solar panel support. The solar panel may be connected to the solar panel support so that they move together. The solar panel may rotate about a single axis of rotation, two axes of rotation, or three axes of rotation.

The solar panel 520 may translate along an axis extending through or parallel to an axis extending through a length of the solar panel support 510. When a solar panel support is laterally flat relative to an inertial reference frame (e.g., is orthogonal to a direction of gravity), the translation of the solar panel may be along a direction lateral relative to the inertial reference frame. However, when the solar panel support has a vertical component relative to the inertial reference frame (e.g., is not orthogonal to the direction of gravity), the translation of the solar panel is not limited to being lateral relative to the inertial reference frame. Even if a solar panel translates along a single direction, the axis itself may change, which may provide a wide range of possible locations for the solar panel. The articulating joint may permit the translational axis of the solar panel to be variable. Optionally, the solar panel may translate with a component of the solar panel support. The solar panel may be connected to the solar panel support or a component of the solar panel support so that they move together. The solar panel may translate along a single axis, along two axes, or along three axes.

Figure 6:
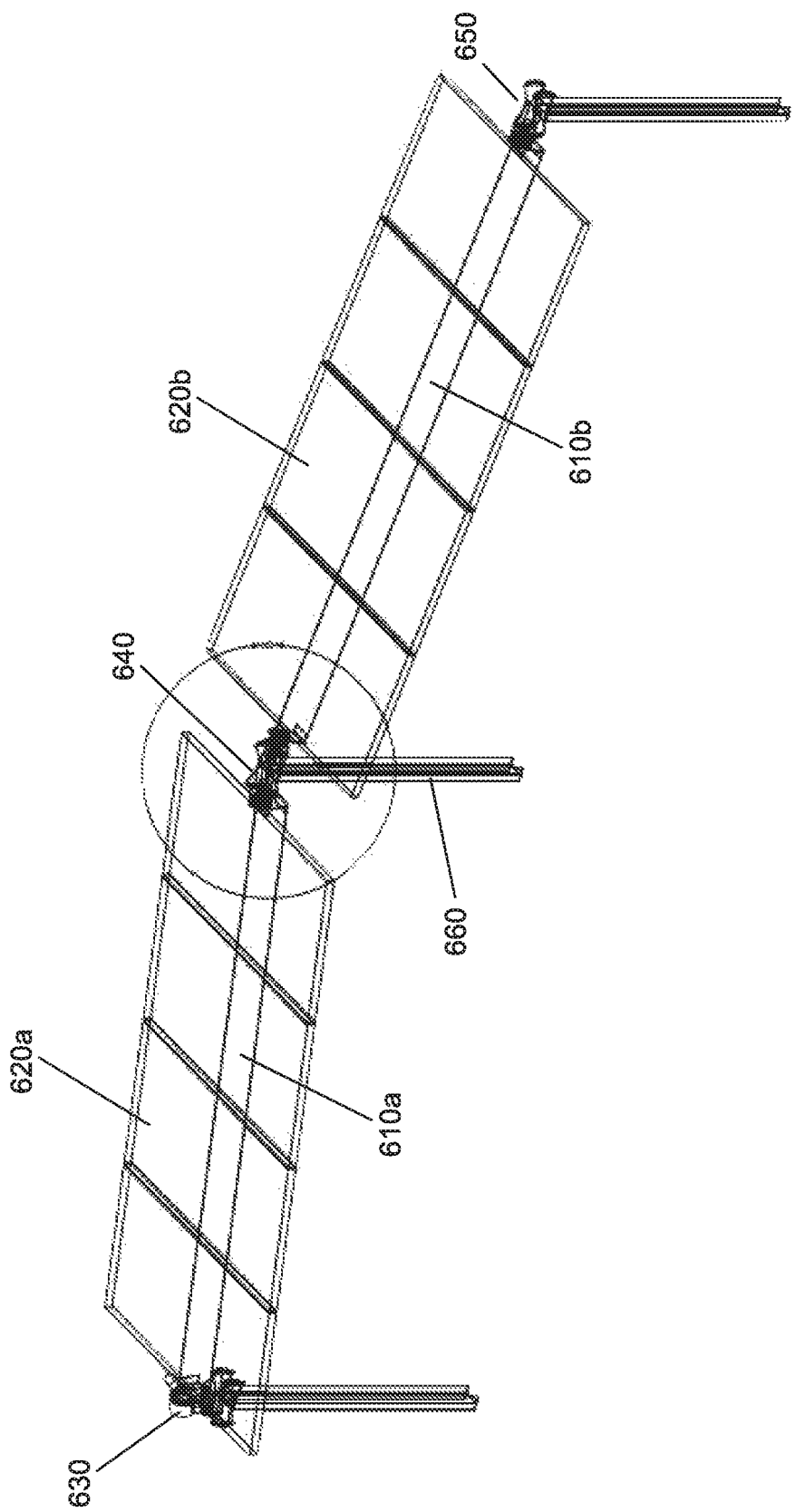
FIG. 6 shows an example of a solar panel array with an articulating joint.

FIG. 6 shows an example of a solar panel array with an articulating joint. A first solar panel support 610a may bear weight of a first solar panel 620a, and a second solar panel support 610b may bear weight of a second solar panel 620b. The first solar panel support may be supported between multiple end-supports 630, 640. The second solar panel support may be supported between multiple end-supports 640, 650. In some instances, an end support between the first solar panel support and the second solar panel support may be an articulating joint 640. The articulating joint may be supported by a support structure 660, such as a support post.

The articulating joint 640 may allow the first solar panel support 610a and the second solar panel support 610b to have non-parallel orientations relative to one another. The articulating joint may permit the first solar panel support and the second solar panel support to have variable orientations relative to one another. The articulating joint may permit rotation of the first solar panel support to affect rotation of the second solar panel support, or vice versa.

Figure 7:
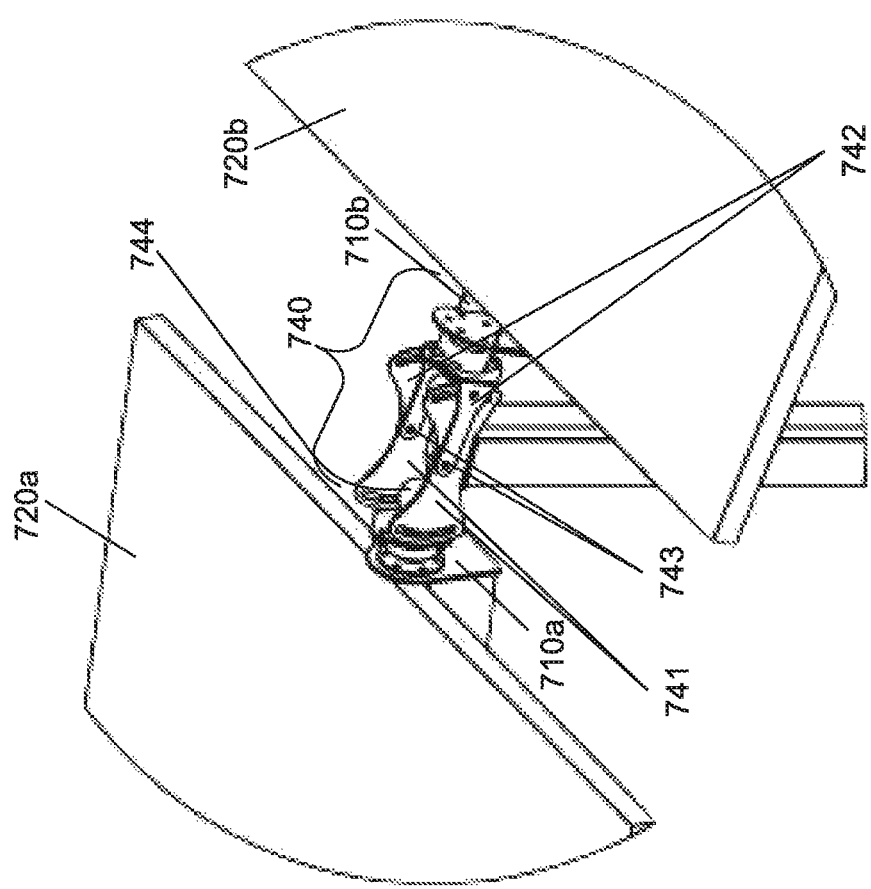
FIG. 7 shows an example of an articulating joint.

FIG. 7 shows an example of an articulating joint. The articulating joint 740 may be used to connect a first solar panel support 710a and a second solar panel support 710b. The articulating joint may or may not be connected to a first solar panel 720a and a second solar panel 720. The first solar panel and the second solar panel may optionally be supported by the first solar panel support and the second solar panel support. The first solar panel may operably couple to the articulating joint with aid of the first solar panel support, and/or the second solar panel may operably couple to the articulating joint with aid of the second solar panel support.

The articulating joint 740 may include a first connection set 741 and a second connection set 742. The first connection set and the second section connection set may connect at a pivot point 743. The pivot point may permit the orientation of the first connection set and the second connection set to change relative to one another. The relative orientation may change about an axis of rotation passing through the pivot point.

The first connection set 741 may include a pair of extension members that may traverse at least a portion of the length of the articulating joint. The extension members may be connected to one another or may be formed as two separate pieces. The first connection set may be formed from a single integral piece or from multiple pieces. The extension members may be substantially parallel to one another. The extension members may include flat pieces such that the flat sides are facing one another in a substantially parallel manner. The extension members may optionally have a roughly contoured shape with wider ends than central portions.

The second connection set 742 may include a pair of demi-extension members that may traverse at least a portion of the length of the articulating joint. Optionally, the demi-extension members of the second connection set may have a smaller length than an extension member of the first connection set. Alternatively, they may have the same length. The demi-extension members may be connected to one another or may be formed as two separate pieces. The second connection set may be formed from a single integral piece or from multiple pieces. The demi-extension members may be substantially parallel to one another. The demi-extension members may include flat pieces such that the flat sides are facing one another in a substantially parallel manner. The demi-extension members may optionally have an elongated shape.

The first connection set and the second connection set may be connected to one another at a pivot point 743. The pivot point may include a pair of contact locations for the first and second connection set. The pair of contact locations may be located along an axis, wherein the orientation of the first connection set may change with respect to an orientation of the second connection set about the axis. The first connection set and/or the second connection set may rotate about the pivot point. In some instances, the first connection set and/or the second connection set may rotate about an unlimited range. Alternatively, the amount of rotation may be limited. Optionally, the first connection set and/or the second connection set may have a track that may limit the amount of rotation about the pivot point. In some instance, the pivot point may be roughly along a central portion along the length of the articulating joint. Portions of the first connection set and the second connection set may overlap one another. For instance, a portion of the extension members and the demi-extension members may overlap one another.

Optionally, the first connection set and/or the second connection set of the articulating joint may be supported by one or more rotational supports 744 which may permit the first connection set and/or the second connection set to rotate about an axis extending through a length of the first connection set and/or the second connection set. A first connection set may pivot about the pivot point 743 and/or rotate about an axis extending through the length of the first connection set. A second connection set may pivot about the pivot point and/or rotate about an axis extending through the length of the second connection set. In some instances, a rotation of the first connection set about the axis extending through the length of the first connection set may cause the second connection set to rotate. The multiple contact points provided by the pivot point may cause a rotational force to be imparted from the first connection set to the second connection set, or vice versa. This may occur, even when the first and second solar panel supports are at different orientations relative to one another. The first and second connection sets may form a linked configuration that may provide flexibility in the positioning of components of joints while permitting certain movements to be imparted across the articulating joint.

An articulating joint may permit the first and second solar panel supports (and/or the first and second solar panels) to have any degree of freedom with respect to one another. The articulating joint may incorporate the use of rotation of one or components about a single axis, two axes, or three axes. The articulating joint may incorporate the use of translation of one or components along a single axis, two axes, or three axes. In some embodiments, a first axis, second axis, and/or third axis may intersect. They may intersect at the same point. They may intersect at a center of an articulating joint. Alternatively, one or more of the axes may not intersect. The axes may be orthogonal to one another. Alternatively, they need not be orthogonal to one another. Any combination of rotational and/or translational movements may be permitted or limited.

Thus, the articulating joint may permit the first and second solar panel supports to have variable orientations relative to one another, which may optionally include different orientations relative to one another. The articulating joint may convey rotation of the first solar panel support to the second solar panel support, or vice versa.

As previously described, this articulating joint configuration is provided by way of example only. Other types of articulating joints, such as those described elsewhere herein, may be employed.

Figure 8:
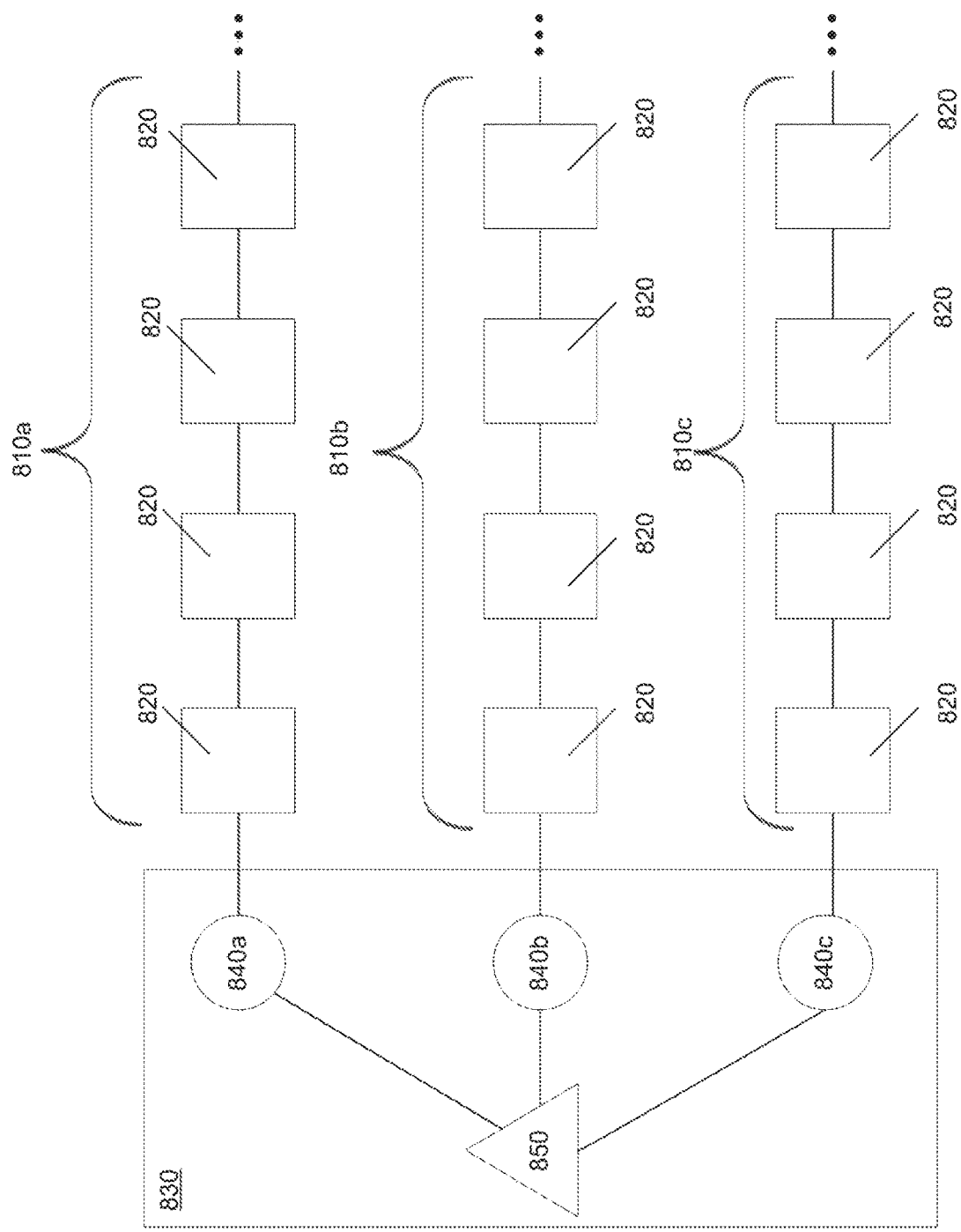
FIG. 8 shows an example of a solar panel array control system that may be in communication with a solar panel array.

FIG. 8 shows an example of a solar panel array control system that may be in communication with a solar panel array. As previously described, the solar panel array control system 830 may communicate with the solar panel array. The control system is provided by way of example only, and is not limiting.

The solar panel array may include one or more groups 810a, 810b, 810c of solar panels 820. The groups may include one or more solar panels connected in series, in parallel, or any combination thereof. The solar panel groups may include rows of solar panels. Any description herein of rows of solar panels may apply to any other type of arrangement or grouping of solar panels. One or more groups of solar panels may make use of articulating joints to provide flexibility in the arrangement of the solar panel groups.

Optionally, each group of solar panels may have a group control system 840a, 840b, 840c. A first group control system 840a may control operation of a first group of solar panels 810a, a second group control system, 840b may control operation of a second group of solar panels 810b, and/or a third group control system, 840c may control operation of a third group of solar panels 810c. The group control systems may be referred to as row controllers when controlling rows of solar panels. Any number of solar panel groups and/or group control systems may be provided. Each group may comprise any number of solar panels. Each group may have the same number of solar panels or differing numbers of solar panels. A central controller 850 may optionally be provided that may control the group control systems.

The solar panel array control system 830 may comprise the central controller 850 and, optionally, one or more group control systems 840a, 840b, 840c. In some instances, one-way communication may be provided from the central controller to the one or more group control systems. The central controller may send instructions to the one or more group control systems, which may in turn control operation of the corresponding solar panel groups. In some instances, two-way communication may be provided between the central controller and the one or more group control systems. For instance, the group controllers may send data to the central controller. The central controller may send instructions to the group controllers in response to, or based on, the data. The data from the one or more group controllers may optionally include data from one or more solar panels, or various types of sensors.

The solar panel array control system may affect operation of the solar panels, which may include positioning of the solar panels. The control system may affect an orientation of the solar panel. The control system may control amount of rotation, rate of rotation, and/or acceleration of rotation of one or more solar panels. The control system may affect a spatial disposition of the solar panel. The control system may control an amount of translation, speed of translation, and/or acceleration of translation of one or more solar panels. The control system may affect operation of one or more driving mechanisms for a solar panel array. The solar panels may be positioned in response to one or more factors, as previously described herein. The solar panel array control system may affect other operations of the solar panels, such as turning the solar panels on or off, operational parameters of converting the solar energy to electrical energy, diagnostics, error detection, calibration, or any other type of operations of the solar panels.

In one example, a method of optimizing power generation throughout a field of trackers may be provided. Operational data for each grouping (e.g., each row) of solar panels may be provided. Any description herein of a row may apply to any grouping. The method may include collecting row-level operational data in aggregate, or piecemeal, to determine the operational characteristics of one or more rows of trackers. Power generation data of each row may be measured to determine if shading is occurring from one row to the next. The method may include analyzing total field power generation to determine if shading specific rows, while further optimizing or adjusting the tilt of other rows for generating power, will increase overall field power generation.

Row-level tests may be performed to determine the impact of shading of one or more rows on the one or more neighboring rows with regard to power generation of the neighboring rows. Row-level tests may be performed on one or more rows to determine if an optimum orientation assumption yields optimum or increased power generation. Tracking schedules may be updated to optimize or increase power generation throughout a tracker field or for each individual row. Row-level power generation may be monitored and compared with weather station reports to determine if sun-tracking operations or non-sun-tracking operations will yield greater power generation. Based on the comparison, an operation may be selected to yield the greater power generation.

These and other examples provided in this paper are intended to illustrate but not necessarily to limit the described implementation. As used herein, the term "implementation" means an implementation that serves to illustrate by way of example but not limitation. The techniques described in the preceding text and figures can be mixed and matched as circumstances demand to produce alternative implementations.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for controlling movement of solar panels within a solar panel array under solar illumination, the method comprising:
    determining current angular orientations of a first solar panel and a second solar panel, the first solar panel attached to a first solar panel support capable of rotating about a first rotation axis and the second solar panel attached to a second solar panel support capable of rotating about a second rotation axis, the first solar panel support connected to the second solar panel support in such a manner that the first rotation axis and the second rotation axis are not colinear;
    in the current angular orientations of the first solar panel and the second solar panel, measuring electric power through the first solar panel and the second solar panel generated by the solar illumination;
    determining desired angular orientations of the first solar panel and the second solar panel based on the current angular orientations of the first solar panel and the second solar panel and the electric power through the first solar panel and the second solar panel in the current angular orientations; and
    controlling a first rotation of the first solar panel around the first rotation axis and a second rotation of the second solar panel around the second rotation axis to reorient the first solar panel and the second solar panel to the desired angular orientations, the first rotation of the first solar panel around the first rotation axis driving the second rotation of the second solar panel around the second rotation axis through a flexible joint.

2. The method of claim 1, wherein the desired angular orientations of the first solar panel and the second solar panel increase total power generated in the solar panel array by the solar illumination compared to the current angular orientations.

3. The method of claim 2, wherein the desired angular orientations increase power generated by the first solar panel and the second solar panel.

4. The method of claim 1, wherein the desired angular orientations of the first solar panel and the second solar panel decrease total power generated in the solar panel array by the solar illumination compared to the current angular orientations.

5. The method of claim 1, wherein determining the desired angular orientations of the first solar panel and the second solar panel comprises determining an amount of shading of the first solar panel and the second solar panel by one or more other solar panels in the solar panel array based on the electric power through the first solar panel and the second solar panel in the current angular orientations.

6. The method of claim 5, wherein the desired angular orientations of the first solar panel and the second solar panel reduce the amount of shading of the first solar panel and the second solar panel compared to the current angular orientations.

7. The method of claim 5, wherein the desired angular orientations of the first solar panel and the second solar panel increase the amount of shading of the first solar panel and the second solar panel compared to the current angular orientations.

8. The method of claim 6, wherein the desired angular orientations of the first solar panel and the second solar panel increase total power generated in the solar panel array by the solar illumination compared to the current angular orientations of the first solar panel and the second solar panel.

9. The method of claim 1, comprising:
    determining current angular orientations of one or more other solar panels in the solar panel array; and
    in the current angular orientations of the one or more other solar panels, measuring electric power through the one or more other solar panels generated by the solar illumination;
    wherein determining the desired angular orientations of the first solar panel and the second solar panel comprises comparing the electric power through the first solar panel and the second solar panel to the electric power through the one or more other solar panels.

10. The method of claim 9, wherein the desired angular orientations of the first solar panel and the second solar panel reduce shading of the one or more other solar panels compared to the current angular orientations of the first solar panel and the second solar panel.

11. The method of claim 9, wherein the desired angular orientations of the first solar panel and the second solar panel increase shading of the one or more other solar panels compared to the current angular orientations of the first solar panel and the second solar panel.

12. The method of claim 10, wherein the desired angular orientations of the first solar panel and the second solar panel increase total power generated in the solar panel array by the solar illumination compared to the current angular orientations of the first solar panel and the second solar panel.

13. The method of claim 1, wherein the flexible joint is an articulating joint.

14. The method of claim 13, wherein the flexible joint is centered on a support structure that supports the flexible joint above an underlying surface.

15. The method of claim 14, wherein the support structure is a post and the flexible joint is centered on top of the post.

16. The method of claim 1, comprising:
- in the current angular orientations of the first solar panel and the second solar panel, measuring a voltage across the first solar panel and the second solar panel; and
- determining the desired angular orientations of the first solar panel and the second solar panel based on the current angular orientations of the first solar panel and the second solar panel, the electric power through the first solar panel and the second solar panel in the current angular orientations, and the voltage across the first solar panel and the second solar panel in the current angular orientations.

* * * * *